(12) United States Patent
Dimitrov et al.

(10) Patent No.: US 8,077,502 B2
(45) Date of Patent: Dec. 13, 2011

(54) ELECTRONIC DEVICES UTILIZING SPIN TORQUE TRANSFER TO FLIP MAGNETIC ORIENTATION

(75) Inventors: Dimitar V. Dimitrov, Edina, MN (US); Olle Gunnar Heinonen, Eden Prairie, MN (US); Yiran Chen, Eden Prairie, MN (US); Haiwen Xi, Prior Lake, MN (US); Xiaohua Lou, Bloomington, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/070,540

(22) Filed: Mar. 24, 2011

(65) Prior Publication Data

US 2011/0169114 A1    Jul. 14, 2011

Related U.S. Application Data

(63) Continuation of application No. 12/415,243, filed on Mar. 31, 2009, now Pat. No. 7,933,146.

(60) Provisional application No. 61/103,765, filed on Oct. 8, 2008.

(51) Int. Cl.
    *G11C 11/00* (2006.01)

(52) U.S. Cl. ..... 365/158; 365/148; 365/171; 365/225.5; 365/243.5; 977/935

(58) Field of Classification Search ............ 365/48, 365/55, 62, 66, 74, 78, 80–93, 100, 130, 365/131, 148, 158, 171–173, 209, 213, 225.5, 365/230.07, 232, 243.5; 216/22; 257/421, 257/E21.665; 438/3; 428/810–816, 817–825.1, 428/826; 977/933–935
See application file for complete search history.

(56) References Cited

U.S. PATENT DOCUMENTS

| | | | |
|---|---|---|---|
| 5,640,343 | A | 6/1997 | Gallagher |
| 5,695,864 | A | 12/1997 | Slonczewski |
| 5,734,605 | A | 3/1998 | Zhu |

(Continued)

FOREIGN PATENT DOCUMENTS

EP        1248265        10/2002

(Continued)

OTHER PUBLICATIONS

U.S. Appl. No. 12/415,257, filed Mar. 31, 2009, Dimitrov.

(Continued)

*Primary Examiner* — Richard Elms
*Assistant Examiner* — Harry W Byrne
(74) *Attorney, Agent, or Firm* — Mueting, Raasch & Gebhardt

(57) ABSTRACT

Electronic devices that include (i) a magnetization controlling structure; (ii) a tunnel barrier structure; and (iii) a magnetization controllable structure including: a first polarizing layer; and a first stabilizing layer, wherein the tunnel barrier structure is between the magnetization controlling structure and the magnetization controlling structure and the first polarizing layer is between the first stabilizing layer and the tunnel barrier structure, wherein the electronic device has two stable overall magnetic configurations, and wherein a first unipolar current applied to the electronic device will cause the orientation of the magnetization controlling structure to reverse its orientation and a second unipolar current applied to the electronic device will cause the magnetization controllable structure to switch its magnetization in order to obtain one of the two stable overall magnetic configurations, wherein the second unipolar current has an amplitude that is less than the first unipolar current.

20 Claims, 8 Drawing Sheets

U.S. PATENT DOCUMENTS

| | | | |
|---|---|---|---|
| 5,991,193 | A | 11/1999 | Gallagher |
| 6,130,835 | A | 10/2000 | Scheuerlein |
| 6,169,686 | B1 | 1/2001 | Brug |
| 6,256,223 | B1 | 7/2001 | Sun |
| 6,331,944 | B1 | 12/2001 | Monsma |
| 6,385,082 | B1 | 5/2002 | Abraham |
| 6,714,444 | B2 | 3/2004 | Huai |
| 6,798,689 | B2 | 9/2004 | Muller |
| 6,873,544 | B2 | 3/2005 | Perner |
| 6,925,000 | B2 | 8/2005 | Sussner |
| 6,977,838 | B1 | 12/2005 | Tsang |
| 6,982,916 | B2 | 1/2006 | Tsang |
| 7,009,877 | B1 | 3/2006 | Huai |
| 7,031,178 | B2 | 4/2006 | Parkin |
| 7,098,494 | B2 | 8/2006 | Pakala |
| 7,187,577 | B1 | 3/2007 | Wang |
| 7,218,550 | B2 | 5/2007 | Schwabe |
| 7,224,601 | B2 | 5/2007 | Panchula |
| 7,230,844 | B2 | 6/2007 | Deak |
| 7,272,034 | B1 | 9/2007 | Chen |
| 7,282,755 | B2 | 10/2007 | Pakala |
| 7,286,395 | B2 | 10/2007 | Chen |
| 7,289,356 | B2 | 10/2007 | Diao |
| 7,345,912 | B2 | 3/2008 | Luo |
| 7,369,427 | B2 | 5/2008 | Diao |
| 7,379,327 | B2 | 5/2008 | Chen |
| 7,382,664 | B2 | 6/2008 | Le Phan |
| 7,394,684 | B2 | 7/2008 | Inokuchi |
| 7,489,541 | B2 | 2/2009 | Pakala |
| 7,502,249 | B1 | 3/2009 | Ding |
| 7,515,457 | B2 | 4/2009 | Chen |
| 7,596,015 | B2 * | 9/2009 | Kitagawa et al. ............ 365/158 |
| 7,768,824 | B2 * | 8/2010 | Yoshikawa et al. ........... 365/173 |
| 2002/0136047 | A1 | 9/2002 | Scheuerlein |
| 2003/0007398 | A1 * | 1/2003 | Daughton et al. ............ 365/200 |
| 2003/0168684 | A1 | 9/2003 | Pan |
| 2006/0018057 | A1 | 1/2006 | Huai |
| 2006/0209600 | A1 | 9/2006 | Le Phan |
| 2007/0019337 | A1 * | 1/2007 | Apalkov et al. ............ 360/324.1 |
| 2007/0085068 | A1 * | 4/2007 | Apalkov et al. ................... 257/1 |
| 2007/0096229 | A1 * | 5/2007 | Yoshikawa et al. ........... 257/421 |
| 2007/0105241 | A1 | 5/2007 | Leuschner |
| 2007/0246787 | A1 | 10/2007 | Wang |
| 2007/0297220 | A1 * | 12/2007 | Yoshikawa et al. ........... 365/158 |
| 2008/0117553 | A1 | 5/2008 | Carey |
| 2008/0144355 | A1 | 6/2008 | Boeve |
| 2008/0164547 | A1 * | 7/2008 | Higo et al. ..................... 257/421 |
| 2008/0197431 | A1 | 8/2008 | Morise |
| 2008/0205125 | A1 | 8/2008 | Kajiyama |
| 2008/0225583 | A1 * | 9/2008 | Guo et al. ...................... 365/173 |
| 2008/0258247 | A1 * | 10/2008 | Mancoff et al. ............... 257/421 |
| 2008/0273380 | A1 | 11/2008 | Diao |
| 2008/0310213 | A1 | 12/2008 | Chen |
| 2008/0310214 | A1 * | 12/2008 | Wang et al. ................... 365/158 |
| 2008/0310219 | A1 | 12/2008 | Chen |
| 2009/0027810 | A1 * | 1/2009 | Horng et al. ................ 360/324.2 |
| 2009/0040855 | A1 | 2/2009 | Luo |
| 2009/0050991 | A1 | 2/2009 | Nagai |
| 2009/0185410 | A1 | 7/2009 | Huai |
| 2009/0302403 | A1 | 12/2009 | Nguyen |
| 2010/0007344 | A1 | 1/2010 | Guo |

FOREIGN PATENT DOCUMENTS

| | | |
|---|---|---|
| EP | 1296331 | 3/2003 |
| EP | 1321943 | 6/2003 |

OTHER PUBLICATIONS

U.S. Appl. No. 12/234,929, filed Sep. 22, 2008, Xi.

J.C. Slonczweski, PRB, vol. 39, 10, p. 6995 (1989).

Hosomi et al., Electron Devices Meeting, 2005, IEDM Technical Digest, IEEE International, pp. 459-462.

H. (N)or (H)umata, T. Suzuki, N. Ohshima, S. Fukami, K. Nagahara, N. Ishiwata, and N. Kasai, Scalable Cell Technology Utilizing Domain Wall Motion for High Speed MRAM, T12B-4, Symposium on VLSI Technology, Japan 2007.

J.C. Sun et al., APL 90, 121128 (2007).

Myoung, Jae Lee et al., in 2 Stack 1D-1R Cross Point Structure with Oxide Diodes as Switch Elements in High Density Resistance RAM Applications, IEDM 2007.

M. Nakayama et al., JAP 103, 07A710 (2008).

Agilent 81140A Series 81141A/81142A Serial Pulse Data Generators 7GHz and 13.5 GHz, Data Sheet, Version 1.1.

Akerman, Toward a Universal Memory, Science, vol. 308, Apr. 22, 2005.

Kawahara et al., Spin-Transfer Torque RAM (SPRAM) with Bit-by-Bit Bidirectional Current Write and Parallelizing-Direction Current Read, ISSCC 07, San Francisco, Feb. 2007.

LeClair et al., Sign Reversal of Spin Polarization in Co/Ru/$Al_2O_3$/Co Magnetic Tunnel Junctions, Physical Review B, vol. 64, 100406(R).

Li, et al., Bias Dependence and Inversion of the Tunneling Magnetoresistance in Ferromagnetic Junctions, Physical Review B 69, 054410 (2004).

Ozatay et al., Spin Transfer by Nonuniform Current Injection Into a Nanomagnet, Applied Physics Letters 88, 202502 (2006).

Sharma et al., Inversion of Spin Polarization and Tunneling Magnetoresistance in Spin-Dependent Tunneling Junctions, Physical Review Letters, vol. 82, No. 3, Jan. 18, 1999.

Slonczewski, J.C., Current-Driven Excitation of Magnetic Multilayers, Journal of Magnetism and Magnetic Materials 159 (1996) L1-L7.

U.S. Appl. No. 12/415,243, filed Mar. 31, 2009, Inventors: Dimitrov.

Valenzuela et al., Spin Polarized Tunneling at Finite Bias, Physical Review Letters, PRL 94, 196601 (2005).

Waintal, et al., Role of Spin-Dependent Interface Scattering in Generating Current-Induced Torques in Magnetic Multilayers, Phy. Rev. B, vol. 62, 12317 (2000).

Yuasa et al., Spin-Polarized Resonant Tunneling in Magnetic Tunnel Junctions, Science 297, 234 (2002).

* cited by examiner

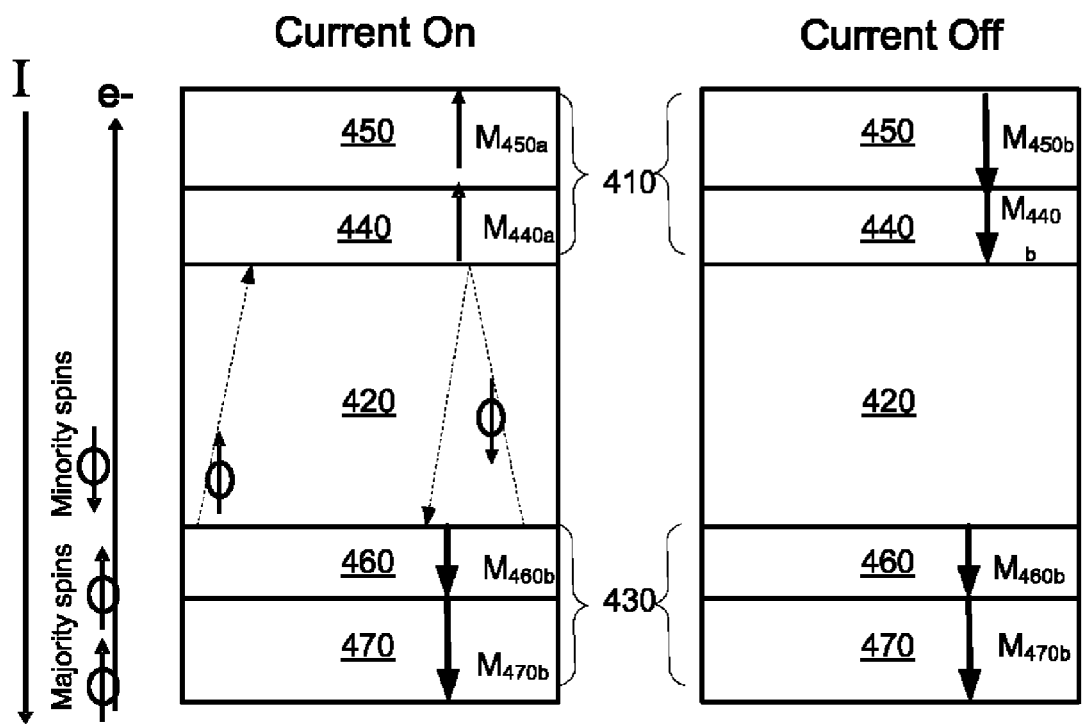
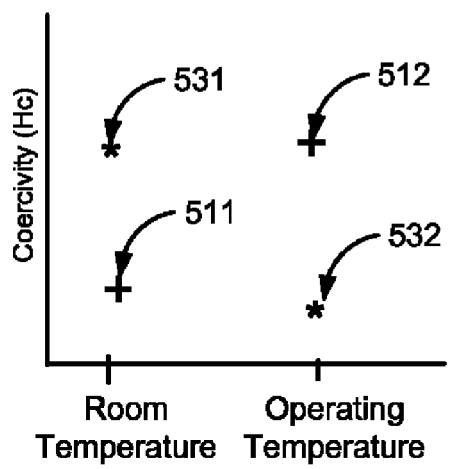
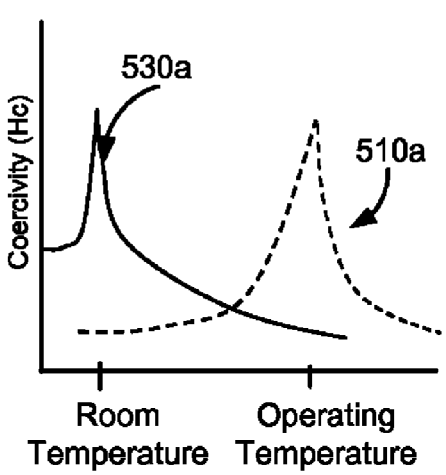
FIG. 4C  FIG. 4D
FIG. 5A  FIG. 5B

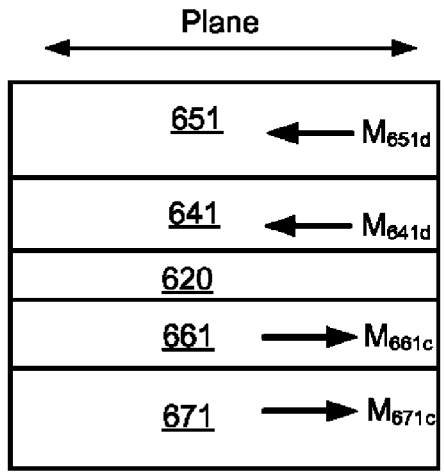
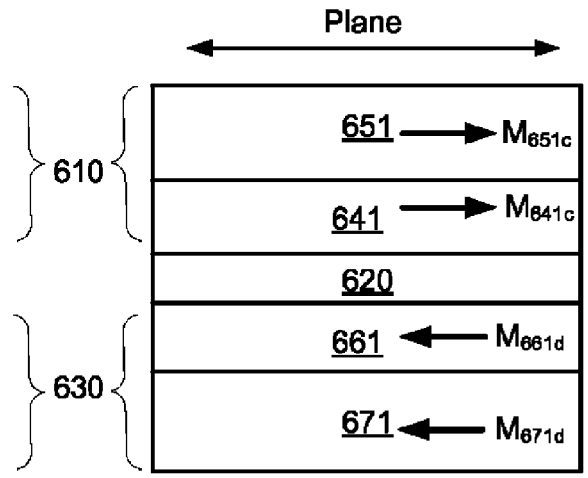
FIG. 6A　　　　　　　　FIG. 6B
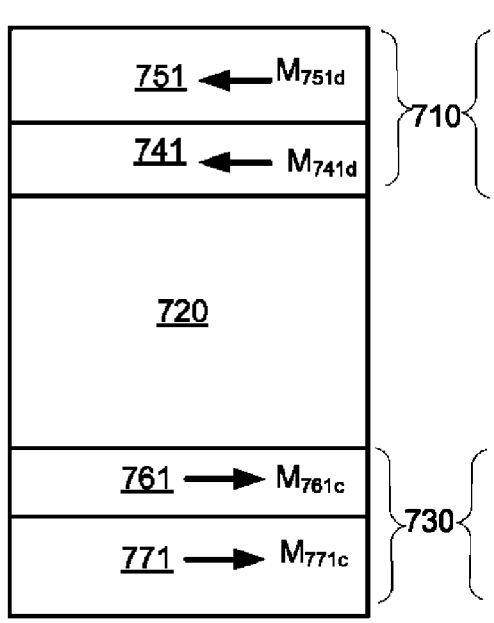
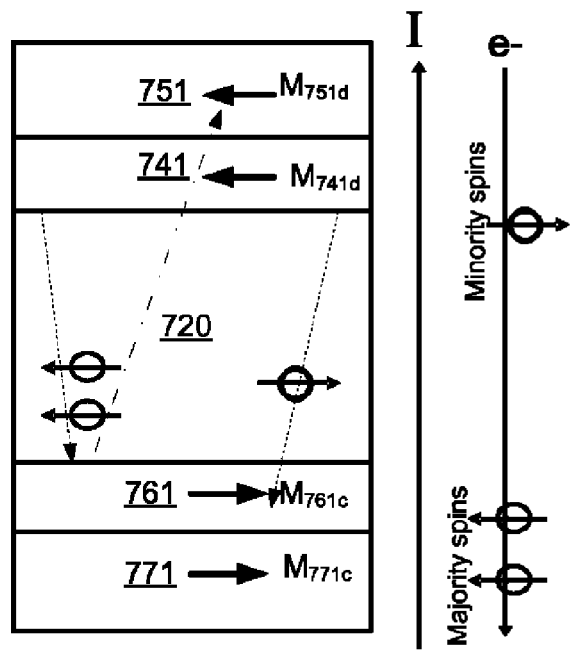
FIG. 7A　　　　　　　　FIG. 7B

ELECTRONIC DEVICES UTILIZING SPIN TORQUE TRANSFER TO FLIP MAGNETIC ORIENTATION

PRIORITY

This application claims priority to U.S. application Ser. No. 12/415,243 filed Mar. 31, 2009 which claims priority to U.S. Provisional Application No. 61/103,765, entitled "SPIN MOMENTUM TRANSFER (SMT) DRIVEN MAGNETIC FLIP FLOP DEVICE" filed on Oct. 8, 2008, the disclosure of which is incorporated herein by reference.

BACKGROUND

Spintronics is an area of technology that utilizes the spin of electrons to manipulate various properties of a device, such as magnetic state or resistance for example. Much of the technology is based on the phenomena called spin momentum transfer effect or spin torque transfer effect. Spin torque transfer effect refers to the effect of a spin-polarized current when it interacts with the local magnetization of a magnetic layer. There is significant interest in using the spin torque transfer effect as a basis for spin torque driven non-volatile magnetic random access memory (MRAM), magnetic race track memory, MRAM with moving domain walls, and as interconnects that use spin waves instead of electric currents for data propagation. Because of the interest in spintronics for such diverse applications, there is a need for simple building blocks that can be used to create more complex systems.

BRIEF SUMMARY

Disclosed are electronic devices that include (i) a magnetization controlling structure; (ii) a tunnel barrier structure; and (iii) a magnetization controllable structure including: a first polarizing layer; and a first stabilizing layer, wherein the tunnel barrier structure is between the magnetization controlling structure and the magnetization controllable structure and the first polarizing layer is between the first stabilizing layer and the tunnel barrier structure, wherein the electronic device has two stable overall magnetic configurations, and wherein a first unipolar current applied to the electronic device will cause the orientation of the magnetization controlling structure to reverse its orientation and a second unipolar current applied to the electronic device will cause the magnetization controllable structure to switch its magnetization in order to obtain one of the two stable overall magnetic configurations, wherein the second unipolar current has an amplitude that is less than the first unipolar current.

Disclosed are electronic devices that include (i) a magnetization controlling structure having a first magnetic coercivity at a first temperature and a second magnetic coercivity at a second temperature higher than the first temperature; (ii) a tunnel barrier structure; and (iii) a magnetization controllable structure including a first polarizing layer; and a first stabilizing layer, wherein the tunnel barrier structure is between the magnetization controlling structure and the magnetization controllable structure and the first polarizing layer is between the first stabilizing layer and the tunnel barrier structure, wherein the first magnetic coercivity of the magnetization controlling structure is higher than the first magnetic coercivity of the magnetization controllable structure and the second magnetic coercivity of the magnetization controlling structure is lower than the second magnetic coercivity of the magnetization controllable structure.

Disclosed are methods of affecting the properties of an electronic device that include the steps of providing an electronic device, the electronic device that includes (i) a magnetization controlling structure; (ii) a tunnel barrier structure; and (iii) a magnetization controllable structure including a first polarizing layer; and a first stabilizing layer, wherein the tunnel barrier structure is between the magnetization controlling structure and the magnetization controllable structure and the first polarizing layer is between the first stabilizing layer and the tunnel barrier structure; applying a first unipolar current to the electronic device, wherein the first current causes the magnetization orientation of the magnetization controlling structure to be flipped; and applying a second unipolar current in the same direction as the first unipolar current to the electronic device, wherein application of the second unipolar current causes the magnetization orientation of the magnetization controllable structure to be flipped.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which:

FIG. 4A depicts the exemplary device of FIG. 3A before a first current is applied thereto;

FIGS. 4B and 4C depict the exemplary device of FIG. 3A while the first current is flowing through the device;

FIG. 4D depicts the exemplary device of FIG. 3A while a second current is applied thereto;

FIGS. 5A, 5B, 5C and 5D illustrate coercivity versus temperature profiles of materials that can be utilized for stabilizing layers in disclosed devices;

FIGS. 6A and 6B demonstrate the two stable magnetic configurations of an exemplary in-plane anisotropy and magnetization device;

FIG. 7A depicts the exemplary device of FIG. 6A before a first current is applied thereto;

FIGS. 7B and 7C depict the exemplary device of FIG. 6A while the first current is flowing through the device;

FIG. 7D depicts the exemplary device of FIG. 6A while a second current is applied thereto;

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Embodiments other than those specifically discussed herein are contemplated and may be made without departing from the scope or spirit of the present disclosure. The following detailed description is not limiting. The definitions provided are to facilitate understanding of certain terms frequently used and do not limit the disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g., 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification, use of a singular form of a term, can encompass embodiments including more than one of such term, unless the content clearly dictates otherwise. For example, the phrase "adding a solvent" encompasses adding one solvent, or more than one solvent, unless the content clearly dictates otherwise. As used in this specification and the appended claims, the term "or" is generally employed in its sense including "either or both" unless the context clearly dictates otherwise.

"Include," "including," or like terms means encompassing but not limited to, that is, including and not exclusive.

Disclosed are electronic devices that utilize the spin torque transfer effect to switch between two magnetic states. The device advantageously utilizes unipolar current to affect the switch.

Figure 1:
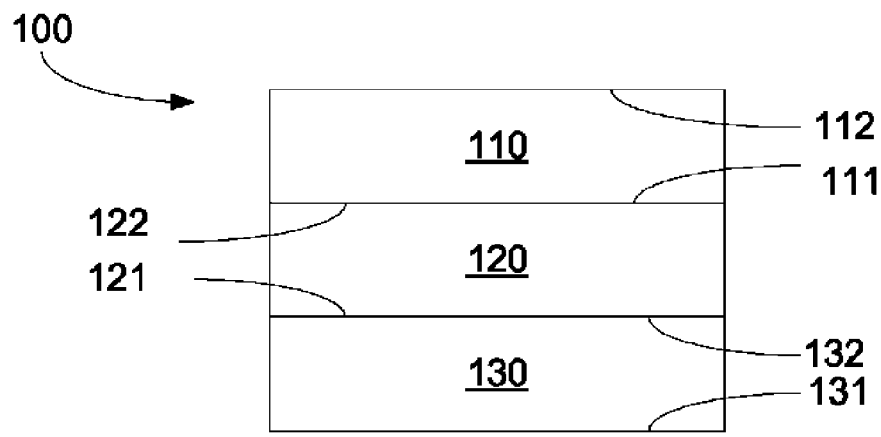
FIG. 1 is a schematic representation of an exemplary disclosed device.

FIG. 1 illustrates an embodiment of a disclosed electronic device 100. An exemplary electronic device 100 includes a magnetization controlling structure 130 (also referred to simply as a controlling structure 130), a tunnel barrier structure 120, and a magnetization controllable structure 110 (also referred to simply as a controllable structure 110). A structure, as that term is used herein can, but need not include more than one layer. In embodiments, a structure (e.g. a controlling structure 130, a tunnel barrier structure 120 or a controllable structure 110) can include a single layer of a single material, multiple layers of a single material or multiple layers of multiple materials. Controllable structure 110 and controlling structure 130 or devices that include such structures can also be referred to as first and second flip-flop structures or layers.

The controlling structure 130 has a first surface 131 and a second surface 132. The tunnel barrier structure 120 has a first surface 121 and a second surface 122. The controllable structure 110 has a first surface 111 and a second surface 112. In embodiments, the second surface 132 of the controlling structure 130 can be adjacent to, directly adjacent to, or in contact with the first surface 121 of the tunnel barrier structure 120 (similarly, the first surface 121 of the tunnel barrier structure 120 can be adjacent to, directly adjacent to, or in contact with the second surface 132 of the controlling structure 130). In embodiments, the second surface 122 of the tunnel barrier structure 120 can be adjacent to, directly adjacent to, or in contact with the first surface 111 of the controllable structure 110 (similarly, the first surface 111 of the controllable structure 110 can be adjacent to, directly adjacent to, or in contact with the second surface 122 of the tunnel barrier structure 120). In embodiments, the tunnel barrier structure 120 can be located between the controlling structure 130 and the controllable structure 110. In embodiments, the tunnel barrier structure 120 can be positioned between the controlling structure 130 and the controllable structure 110.

The tunnel barrier structure 120 can generally include a material or materials that can afford a relatively large spin momentum transfer through the structure and are non-magnetic. Exemplary materials include oxide materials such as alumina ($Al_2O_3$), titanium oxides ($TiO_x$), magnesium oxide (MgO), zinc oxide (ZnO), hafnium oxide (HfO), gallium oxide (GaO), and combinations thereof. Other useful materials can also be utilized for the tunnel barrier structure 120. Any useful thickness of the material or materials of the tunnel barrier structure 120 can be utilized. In embodiments, the tunnel barrier structure 120 can have a thickness from about 0.5 nanometers (nm) to about 15 nm depending at least in part on the identity of the material or materials making up the tunnel barrier structure 120.

Figure 2:
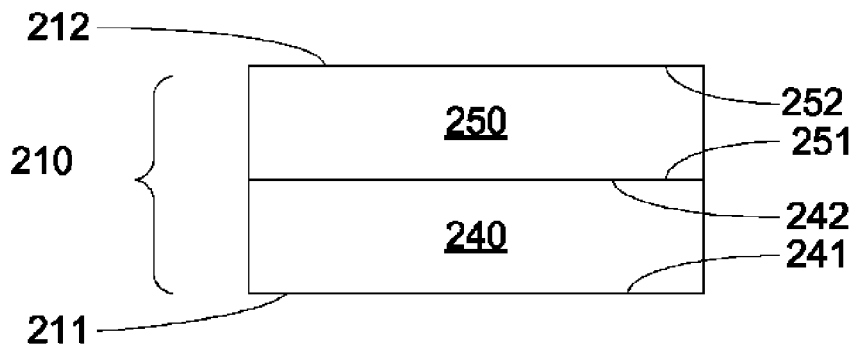
FIG. 2 is a schematic representation of an exemplary controllable structure of a disclosed device.

An embodiment of an exemplary controllable structure is depicted in FIG. 2. An exemplary controllable structure 210 includes a polarizing layer 240 (also referred to as a first polarizing layer 240) and a stabilizing layer 250 (also referred to as a first stabilizing layer 250. In embodiments, a "layer" can refer to a single layer of a single material, and in other embodiments, a "layer" can refer to multiple layers of a single material and in embodiments a "layer" can refer to multiple layers of multiple materials. The polarizing layer 240 has a first surface 241 and a second surface 242. The stabilizing layer 250 has a first surface 251 and a second surface 252. In embodiments, the second surface 242 of the polarizing layer 240 can be adjacent to, directly adjacent to, or in contact with the first surface 251 of the stabilizing layer 250, and similarly, the first surface 251 of the stabilizing layer 250 can be adjacent to, directly adjacent to, or in contact with the second surface 242 of the polarizing layer 240. In embodiments, the first surface 211 of the controllable structure 210 can be substantially composed of the polarizing layer 240. In embodiments, the second surface 212 of the controllable structure 210 can be substantially composed of the stabilizing layer 250. Therefore, in such embodiments, the second surface of the tunnel barrier structure (122 in FIG. 1) can be adjacent to, directly adjacent to, or in contact with the first surface 241 of the polarizing layer 240 of the controllable structure 210. In embodiments, the polarizing layer 240 can be between the stabilizing layer 250 and the tunnel barrier structure (120 in FIG. 1).

Embodiments of disclosed electrical devices include controlling structures that also include polarizing and stabilizing layers. An example of such a device 300 can be seen in FIG. 3A. The device depicted in FIG. 3A includes a controlling structure 330, a tunnel barrier structure 320 and a controllable structure 310. The controllable structure 310 includes the polarizing layer 340 (also referred to as a second polarizing layer 340) and the stabilizing layer 350 (also referred to as a second stabilizing layer 350) as discussed above. The controlling structure 330 in such an exemplary device can include a polarizing layer 360 and a stabilizing layer 370. As in the controllable structure 310, the polarizing layer 360 has a first surface 361 and a second surface 362; and the stabilizing layer 370 has a first surface 371 and a second surface 372. The second surface 362 of the polarizing layer 360 of the controlling structure 330 can be adjacent to, directly adjacent to, or in contact with the first surface (121 in FIG. 1) of the tunnel barrier structure 320 (or similarly, the first surface of the tunnel barrier structure 320 can be adjacent to, directly adjacent to, or in contact with the second surface 362 of the polarizing layer 360 of the controlling structure 330). The second surface 372 of the stabilizing layer 370 of the controlling structure 330 can be adjacent to, directly adjacent to, or in contact with the first surface 361 of the polarizing layer 360 of the controlling structure 330 (or similarly, the first surface 361 of the polarizing layer 360 of the controlling structure 330 can be adjacent to, directly adjacent to, or in contact with the second surface 372 of the stabilizing layer 370 of the controlling structure 330). In embodiments, the polarizing layer 340 can be between the stabilizing layer 350 and the tunnel barrier structure 320.

The magnetic materials that are included in disclosed electrical devices can either have perpendicular to the plane anisotropy and magnetization or in-plane anisotropy and magnetization. In embodiments, some materials can be made to have either perpendicular to the plane or in-plane anisotropy by choosing an appropriate seed layer. For example CoPt can have perpendicular anisotropy if grown on Ru or CrRu but can have in-plane anisotropy if grown on Ti or Ta. As another illustrative example, FePt can have perpendicular anisotropy if grown on Pt but can have in-plane anisotropy if grown on Ru. In embodiments, the anisotropy of some materials cannot be controlled by the choice of seed layers. For example, materials such as amorphous TbFeCo or GdTbCoFe usually have perpendicular anisotropy and materials such as CoFe, CoNiFe, CoFeB have in-plane anisotropy regardless of the seed layer chosen. Devices that have only magnetic material that is perpendicular to the plane anisotropy and magnetization can be referred to as "perpendicular to the plane anisotropy and magnetization devices" or "perpendicular anisotropy devices". Devices that have only magnetic material that is in-plane anisotropy and magnetization can be referred to as "in-plane anisotropy and magnetization devices" or "in-plane anisotropy devices". Materials that have perpendicular to the plane anisotropy and magnetization have magnetic orientations that are perpendicular to a defined plane of the device. Materials that have in-plane anisotropy and magnetization have magnetic orientations that are parallel to a defined plane of the device. FIGS. 3B, 3C, 4A, 4B, 4C and 4D depict devices that have perpendicular to the plane anisotropy and magnetization; and FIGS. 6A, 6B, 7A, 7B, 7C and 7D depict devices that have in-plane anisotropy and magnetization.

A device that has perpendicular to the plane anisotropy and magnetization will include magnetic materials that only have perpendicular to the plane anisotropy and magnetization. A device that has in-plane anisotropy and magnetization will include magnetic materials that only have in-plane anisotropy and magnetization. It should be noted that both perpendicular to the plane anisotropy and magnetization devices and an in-plane anisotropy and magnetization devices will also include non-magnetic materials (e.g. tunnel barrier structure and optional seed and cap layers).

Figure 3A:
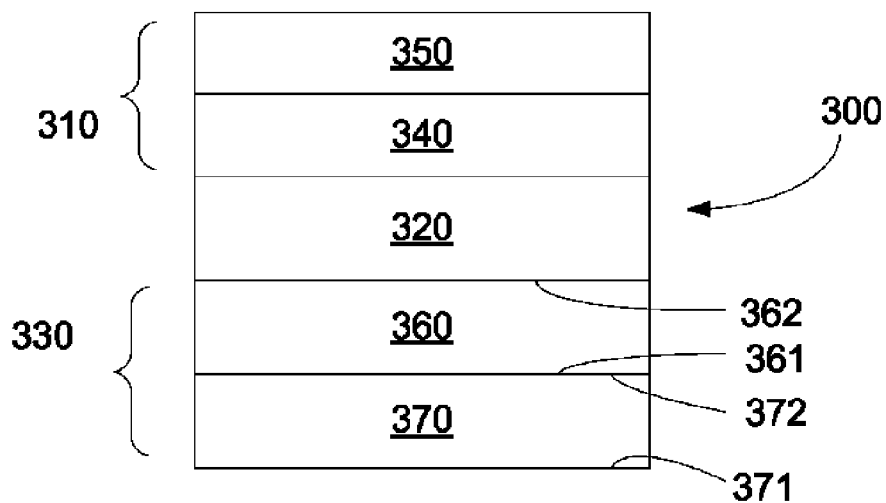
FIG. 3A is a schematic representation of a disclosed device with both controlling structures and controllable structures that include polarizing and stabilizing layers respectively.
Figures 3B, 3C:
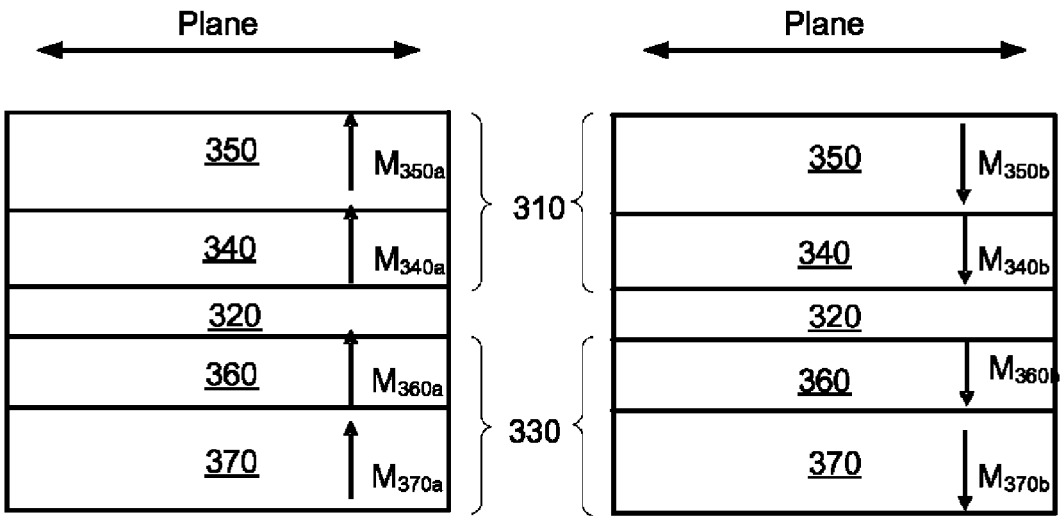
FIGS. 3B and 3C demonstrate the two stable magnetic configurations of the exemplary perpendicular to the plane anisotropy and magnetization device depicted in FIG. 3A.

FIGS. 3B and 3C depict the two stable states of an exemplary perpendicular to the plane anisotropy and magnetization device. The devices depicted in these figures include controlling structures 330, tunnel barrier structures 320 and controllable structures 310 as discussed above. The plane of the devices is depicted by the arrows above the devices. There are two different magnetic configurations, one of which the device will automatically revert to after a perturbation. The first is shown in FIG. 3B and has all of the magnetic moments of the controlling structure 330 and the controllable structure 310 aligned "up", referred to as the "stable up configuration". This is depicted by the arrows depicting the magnetic moment of the stabilizing layer $M_{370a}$ and the polarizing layer $M_{360a}$ of the controlling structure 330; and the magnetic moment of the polarizing layer $M_{340a}$ and the stabilizing layer $M_{350a}$ of the controllable structure 310. The second stable configuration is shown in FIG. 3C and has all of the magnetic moments of the controlling structure 330 and the controllable structure 310 aligned "down", referred to as the "stable down configuration". This is depicted by the arrows depicting the magnetic moment of the stabilizing layer $M_{370b}$ and the polarizing layer $M_{360b}$ of the controlling structure 330; and the magnetic moment of the polarizing layer $M_{340b}$ and the stabilizing layer $M_{350b}$ of the controllable structure 310.

Figures 4A, 4B:
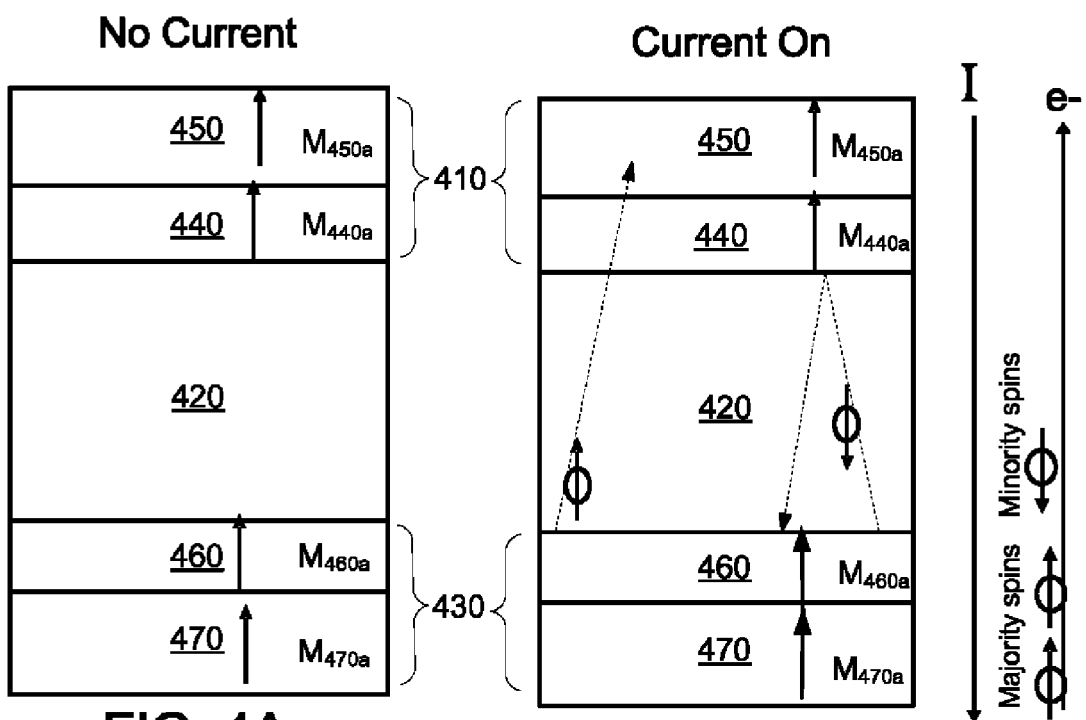

FIGS. 4A, 4B, 4C and 4D illustrate the application of unipolar current to a perpendicular to the plane anisotropy and magnetization device such as that depicted in FIG. 3A. As seen in FIG. 4A, the device includes a controlling structure 430 that includes a stabilizing layer 470 and a polarizing layer 460, a tunnel barrier structure 420 (exaggerated for easier visualization) and a controllable structure 410 that includes a polarizing layer 440 and a stabilizing layer 450. For the sake of example, the device is depicted as being in the stable up configuration, although the same principles apply to the stable down configuration.

FIG. 4B shows the device at the instant a first unipolar current is directed from the controllable structure 410 to the controlling structure 430 as depicted by the arrow labeled "I" on the left side of the figure. Applying current from the controllable structure 410 to the controlling structure 430 causes electrons to flow from the controlling structure 430 to the controllable structure 410, as depicted by the arrow labeled "e⁻" on the left side of the figure. As with all electrical current, some of the electrons will emerge from the polarizing layer 460 with their spin up and some will emerge with their spin down. As seen in this example, a majority of the electrons have their spin up. These majority and minority spins are depicted as spin up and spin down respectively in FIG. 4B. The spin up electrons are depicted on the left of the tunnel barrier structure 420 and the spin down electrons are depicted on the right of the tunnel barrier structure 420. As the electrons flow from the controlling structure 430 through the tunnel barrier structure 420, the electrons that have a spin that is aligned with the polarizing layer 440 of the controllable structure 410 are transmitted through the polarizing layer 440 and through the remainder of the device. The electrons that have a spin that is opposite to the polarizing layer 440 of the controllable structure 410 are back scattered from the polarizing layer 440 of the controllable structure 410. These back scattered electrons create a torque that flips the magnetization orientation of the layers (polarizing layer 460 and stabilizing layer 470) of the controlling structure 430, as seen by comparing the magnetization vectors $M_{460a}$ and $M_{470a}$ in FIG. 4B to the magnetization vectors $M_{460b}$ and $M_{470b}$ as seen in FIG. 4C. FIG. 4C depicts the device after the magnetization of the controlling structure 430 has flipped but the current has not yet been altered.

FIG. 4D depicts the device once a second unipolar current is applied to the device. In this embodiment, the second current that is applied has an amplitude of zero, stated another way, the unipolar current is shut off. When the unipolar current is applied, the temperature of the device is elevated when compared with the unipolar current being off. In embodiments, the temperature of the device can be elevated significantly when the current is on as compared to when the current is off (or decreased). In embodiments, the temperature can be elevated by about 100° C. when the current is on, when compared to the current being off. As discussed above with respect to FIGS. 3B and 3C, there are two stable magnetic configurations of such a device, the stable up configuration and the stable down configuration. The device in FIG. 4C, once the current is shut off, is not in a stable configuration; therefore the device will affect a change in order to return to one of the stable configurations. The materials making up the various structures of the device are chosen so that the controllable structure 410 flips its magnetic orientation instead of the controlling structure 430 flipping back. As seen in FIG. 4D, the magnetization of the polarizing layer 440 and stabilizing layer 450 change from $M_{440a}$ and $M_{450a}$ to $M_{440b}$ and $M_{450b}$ respectively in order for the whole device to be in the stable down configuration, as shown in FIG. 4D.

The polarizing layers in the controlling structure 430 and the controllable structure 410 can be, but need not be, the same material. The materials of the polarizing layer are generally not the portion of the controlling structure 430 and the controllable structure 410 that affect the desired magnetization orientation flip. The polarizing layers are generally made of a material that will polarize electrons that flow through the material. The materials of the polarizing layers are generally chosen to create desirable spin polarization and spin torque transfer effects. In embodiments, the materials of the polarizing layers are chosen to enhance the spin polarization and spin torque transfer effects. Exemplary materials that can be utilized for polarizing layers include cobalt (Co), iron (Fe), cobalt iron alloys (CoFe), cobalt iron boron alloys (CoFeB) and combinations thereof for example. In embodiments, half metallic materials such as $CrO_2$, $Fe_3O_4$, CuMnAl and CuMnSi, for example, may also have advantageous properties.

In embodiments where both the controlling structure 430 and the controllable structure 410 include polarizing layers and stabilizing layers, the materials of the stabilizing layers are chosen so that the magnetization of the controllable structure 410 is effected to conform to the magnetization of the controlling structure 430 and not the other way around. Generally, the material(s) of the stabilizing layer of the controlling structure and the material(s) of the stabilizing layer of the controllable structure are chosen to ensure that when the unipolar current is turned off (or decreased), the controllable structure switches its magnetization in order to become parallel to the magnetization of the controlling structure; instead of the controlling structure switching its magnetization in order to become parallel to the magnetization of the controllable structure, which would simply cause the device to revert to its original, pre-applied unipolar current state.

The coercivity ($H_c$) of a material is the intensity of the applied magnetic field required to modify the magnetization of the material. The larger the coercivity of a material, the more difficult it is to change the magnetization of the material. The smaller the coercivity of a material, the easier it is to change the magnetization of the material. The coercivity of a material can be different at different temperatures. In general, the coercivity of the controlling structure can be lower than the coercivity of the controllable structure at operating temperatures of the device (current on) and the coercivity of the controllable structure is higher than the coercivity of the controlling structure at room temperature (current off or decreased).

In embodiments, materials that make up the stabilizing layer of the controlling structure and materials that make up the stabilizing layer of the controllable structure can have different coercivities at different temperatures. The coercivity at different temperatures can be important because, as discussed above, there can be a difference (in embodiments a significant difference) in the temperature of the device when the unipolar current is on versus off or decreased. Generally, the materials of the two stabilizing layers can be chosen so that the coercivity of the stabilizing layer of the controlling structure is smaller than the coercivity of the stabilizing layer of the controllable structure when the current is on (operating temperature, or a higher temperature) but becomes larger when the current is off or decreased (room temperature or a lower temperature). This ensures that it is the stabilizing layer of the controlling structure that switches when the current is on, but after the current is shut off or decreased, the stabilizing layer of the controlling structure is more stable and forces the stabilizing layer of the controllable structure to switch magnetic orientation. The graphs in FIGS. 5A, 5B, 5C and 5D depict properties of pairs of materials that can be utilized in the two stabilizing layers to affect this phenomenon.

FIG. 5A depicts the coercivity of materials that can be used as the stabilizing layer of the controlling structure 530 and materials that can be used as the stabilizing layer of the controllable structure 510. As seen in this partial depiction of a graph of coercivity versus temperature, a material that can be used for the stabilizing layer of the controlling structure can have a first coercivity 531 at room temperature and a second coercivity 532 at the operating temperature of the device. Similarly, a material that can be used for the stabilizing layer of the controllable structure can have a first coercivity 511 at room temperature and a second coercivity 512 at the operating temperature of the device. Pairs of materials will affect the magnetization effects discussed herein when the first coercivity 531 of the controlling structure is higher than the first coercivity 511 of the controllable structure (i.e. the coercivity of the stabilizing layer of the controlling structure is higher at room temperature than the coercivity of the stabilizing layer of the controllable structure) and the second coercivity 532 of the controlling structure is lower than the second coercivity 512 of the controllable structure (i.e. the coercivity of the stabilizing layer of the controlling structure is lower at operating temperature than the coercivity of the stabilizing layer of the controlling structure). Materials that have this type of temperature dependent coercivity properties will ensure that the stabilizing layer of the controlling structure 530 will be easier to switch when the current is on (operating temperature point of the graph) because the coercivity is lower than the materials of the stabilizing layer of the controllable structure 510; and the stabilizing layer of the controllable structure 510 will be easier to switch when the current is off or decreased (room temperature point of the graph) because the coercivity is lower than the materials of the stabilizing layer of the controlling structure 530.

FIG. 5B depicts a larger portion of a coercivity versus temperature profile of types of materials that have the general properties exemplified by FIG. 5A. The trace labeled 530a depicts the coercivity of the stabilizing layer of the controlling structure 530 and the trace labeled 510a depicts the coercivity of the stabilizing layer of the controllable structure 510. Any pair of materials that exhibit a coercivity versus temperature profile similar to that depicted in FIG. 5B can be utilized in disclosed devices. In embodiments, ferromagnetic materials that can be obtained by alloying rare earth metals with transition metals can be utilized. By changing the composition of the alloy, the high coercivity can be adjusted such that the stabilizing layer of the controlling structure is large at room temperature while the coercivity of the stabilizing layer of the controllable structure is large at elevated temperatures (such as operating temperatures of the device). Rare earth metals include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm) and ytterbium (Yb). Transition metals include scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), lutetium (Lu), hafnium (Hf), tantalum (Ta), tungsten (W), rhenium (Re), osmium (Os), iridium (Ir), platinum (Pt), gold (Au), mercury (Hg) and lawrencium (Lr). In embodiments, pairs of materials that can include for example, alloys of gadolinium (Gd), alloys of terbium (Tb), alloys of dysprosium (Dy), alloys of cobalt (Co) and alloys of samarium (Sm) can be utilized for example. In embodiments, pairs of materials that can include for example, alloys of gadolinium (Gd) and iron (Fe), alloys of terbium (Tb) and iron (Fe), alloys of dysprosium (Dy) and iron (Fe) can be utilized for example. In embodiments, pairs of materials can be chosen from GdFe alloys, TbFe alloys and DyFe alloys for example. Specific exemplary pairs of materials include $Gd_{23}Fe_{77}$ and $Gd_{24}Fe_{76}$; $Tb_{19}Fe_{81}$ and $Tb_{21}Fe_{79}$; and $Dy_{17}Fe_{83}$ and $Dy_{21}Fe_{79}$.

Figure 5C:
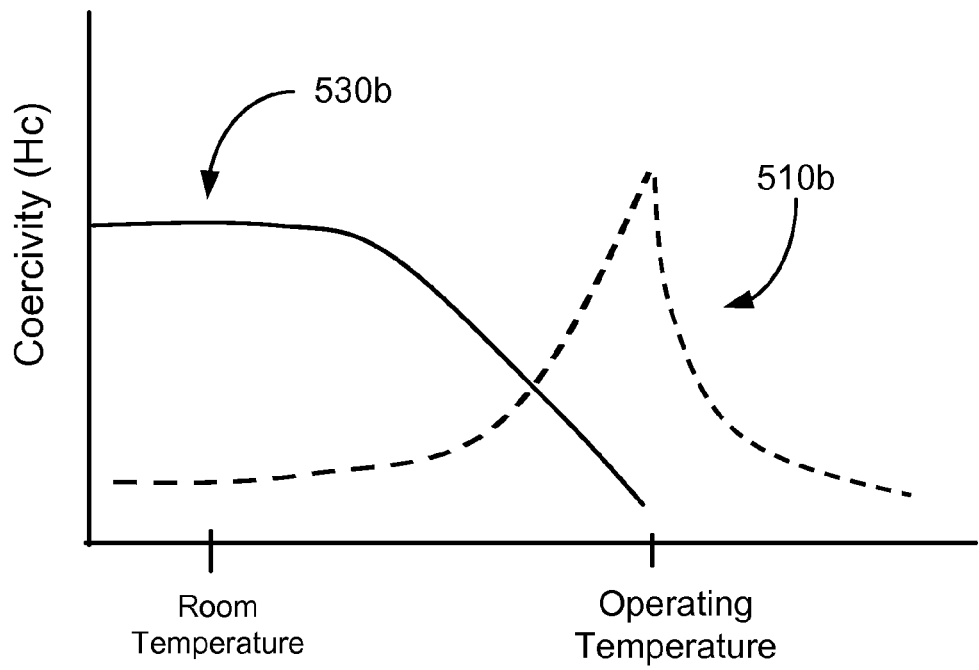

FIG. 5C depicts another coercivity versus temperature profile of types of materials that have the general properties exemplified by FIG. 5A. The trace labeled 530b depicts the coercivity of the stabilizing layer of the controlling structure 530 and the trace labeled 510b depicts the coercivity of the stabilizing layer of the controllable structure 510. Any pair of materials that exhibit a coercivity versus temperature profile similar to that depicted in FIG. 5C can be utilized. In embodiments, the stabilizing layer of the controlling structure 530 is made of a material whose perpendicular anisotropy has a relatively fast monotonic decrease such as that depicted in trace 530b. An exemplary pair of materials for the stabilizing layer of the controllable structure 510 and the controlling structure 530 include a GdTbCoFe material and a TbCoFe material respectively.

Figure 5D:
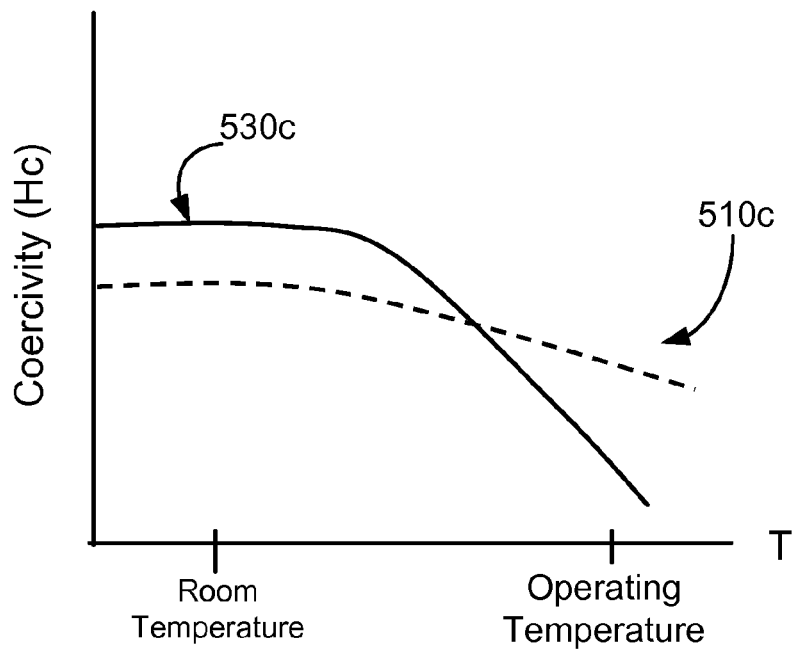

FIG. 5D shows another possible coercivity versus temperature profile of types of materials that can be utilized. In such an embodiment the coercivity 530c of the stabilizing layer of the controlling structure is higher than the coercivity 510c of the stabilizing layer of the controllable structure at room temperature and also decreases faster as temperature increases. Therefore, at operating temperature, the coercivity 510c of the stabilizing layer of the controlling structure will be higher than the coercivity 530c of the stabilizing layer of the controllable structure. In embodiments that exhibit this type of behavior, the stabilizing layer of the controlling structure can be made of terbium cobalt iron (TbCoFe) alloys and the stabilizing layer of the controllable structure can be made of materials including cobalt chromium platinum alloys (CoCrPt), cobalt platinum alloys (CoPt), cobalt platinum multilayers (Co/Pt), cobalt nickel multilayers (Co/Ni), cobalt copper multilayers (Co/Cu) and cobalt palladium multilayers (Co/Pd) for example.

As discussed above, disclosed devices can also have in-plane anisotropy and magnetization. A device that has in-plane anisotropy and magnetization will include magnetic materials that only have in-plane anisotropy and magnetization. It should be noted however that an in-plane device will also include non-magnetic materials (e.g. tunnel barrier structure). In-plane devices are affected by stray magnetic fields. Stray magnetic fields will dictate the stable configurations of in-plane devices. Generally, the stable configurations of in-plane devices are anti-parallel.

FIGS. 6A and 6B depict the two stable states of an exemplary in-plane devices. The devices depicted in these figures include controlling structures 630, tunnel barrier structures 620 and controllable structures 610 as discussed above. The magnetization plane of the devices is depicted by the arrows above the devices. There are two different magnetic configurations, one of which the device will automatically revert to after a perturbation. The first is shown in FIG. 6A and has the magnetic moments of the controlling structure 630 anti-parallel to the magnetic moments of the controllable structure 610, referred to as "stable right-left configuration". This is depicted by the arrows depicting the magnetic moment of the stabilizing layer $M_{671c}$ and the polarizing layer $M_{661c}$ of the controlling structure 630 that both have "right" orientations; and the magnetic moment of the polarizing layer $M_{641d}$ and the stabilizing layer $M_{651d}$ of the controllable structure 610 that both have "left" orientations. The second is shown in FIG. 6B and also has the magnetic moments of the controlling structure 630 and the controllable structure 610 anti-parallel but in the opposite configuration, referred to as "stable left-right configuration". This is depicted by the arrows depicting the magnetic moment of the stabilizing layer $M_{671d}$ and the polarizing layer $M_{661d}$ of the controlling structure 630 that both have "left" orientations; and the magnetic moment of the polarizing layer $M_{641c}$ and the stabilizing layer $M_{651c}$ of the controllable structure 610 that both have "right" orientations.

Figures 7C, 7D:
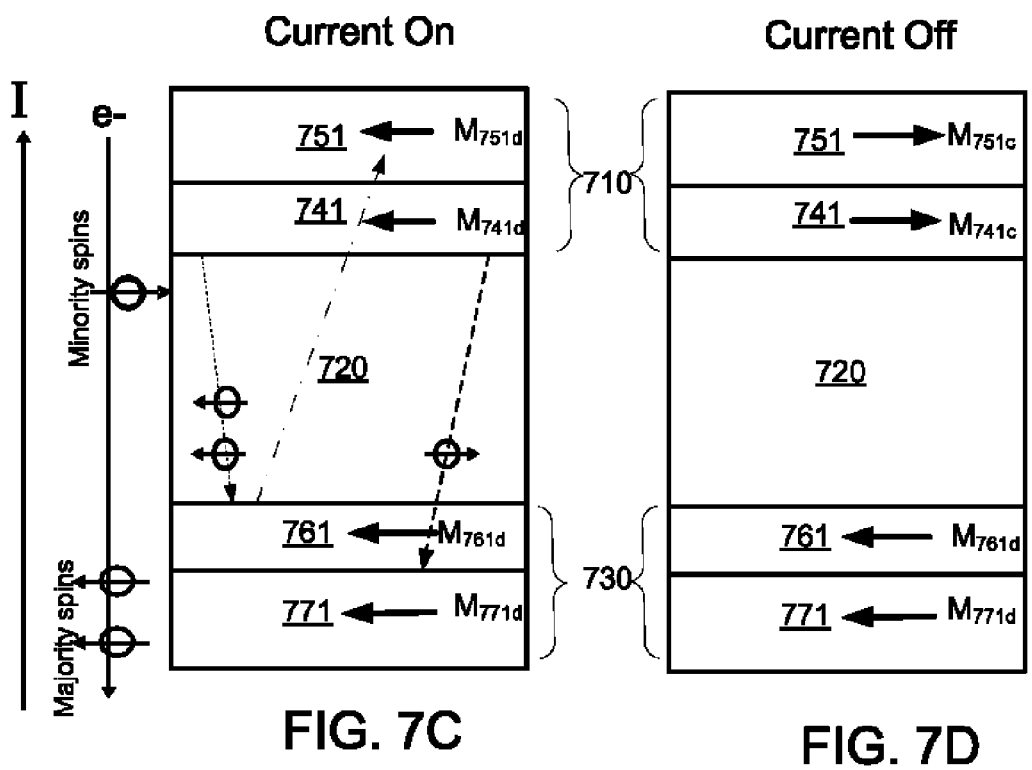

FIGS. 7A, 7B, 7C and 7D illustrate the application of unipolar current to an in-plane anisotropy and magnetization device. As seen in FIG. 7A, the device includes a controlling structure 730 that includes a stabilizing layer 771 and a polarizing layer 761, a tunnel barrier structure 720 (exaggerated for easier visualization) and a controllable structure 710 that includes a polarizing layer 741 and a stabilizing layer 751. For the sake of example, the device is depicted as being in the "stable right-left configuration", although the same principles apply to the "stable left-right configuration".

FIG. 7B depicts the device once a first unipolar current is applied. As opposed to the perpendicular to the plane anisotropy and magnetization device, the current in an in-plane anisotropy and magnetization device is applied from the controlling structure 730 to the controllable structure 710. Therefore, unipolar current is directed from the controlling structure 730 to the controllable structure 710 as depicted by the arrow labeled "I" on the left side of the figure. This causes electrons to flow from the controllable structure 710 to the controlling structure 730, as depicted by the arrow labeled "e⁻" on the left side of the figure. The electrons that flow through the polarizing layer 741 will have both majority and minority spins. These majority and minority spins are depicted as spin left and spin right respectively. In this example, a majority of the electrons are spin left electrons. The spin left electrons are shown on the left of the tunnel barrier structure 720 and the spin right electrons are shown on the right of the tunnel barrier structure 720.

As the electrons flow from the controllable structure 710 through the tunnel barrier structure 720, the electrons that have spins that are aligned with the polarizing layer 761 of the controlling structure 730 are transmitted through the polarizing layer 761 and through the remainder of the device (as depicted for the electrons on the right of the tunnel barrier structure 720). The electrons that have a spin that is opposite to the polarizing layer 761 of the controlling structure 730 (spin left electrons) enter the polarizing layer 761 of the controlling structure 730 and because they are opposite to the magnetization of the polarizing layer 761 create a torque that exerts a force on the magnetization of the polarizing layer 761 of the controlling structure 730. It should also be noted that some of the left spin majority electrons are back scattered from the polarizing layer 761 but because they are aligned with the magnetization of the polarizing layer 741 and the stabilizing layer 751 they do not exert a torque on the polarizing layer 741 and the stabilizing layer 751 of the controllable structure 710. The torque that is exerted on the polarizing layer 761 of the controlling structure 730 by the majority spin left electrons functions to flip the magnetization of the polarizing layer 761 and the stabilizing layer 771 of the controlling structure 730. This can be seen by comparing the magnetization vectors $M_{761c}$ and $M_{771c}$ in FIG. 7B to the magnetization vectors $M_{761d}$ and $M_{771d}$ seen in FIG. 7C. FIG. 7C depicts the device after the magnetization of the controlling structure 730 has flipped but the current has not yet been altered.

FIG. 7D depicts the device after the unipolar current is shut off or decreased. As discussed above with respect to FIGS. 6A and 6B, there are two stable magnetic configurations, the stable left-right configuration and the stable right-left configuration. The device in FIG. 7C, once no current is running through it is not in a stable configuration because all of the magnetic orientations are parallel; therefore the device will affect a change in order to return to one of the stable configurations. The materials making up the device are chosen so that the polarizing layer 741 and stabilizing layer 751 of the controllable structure 710 flips its magnetic orientation instead of the controlling structure 730 flipping its orientation and assumes the configuration shown in FIG. 7D. As seen in FIG. 7D, the magnetization of the polarizing layer 741 and stabilizing layer 751 change from $M_{741d}$ and $M_{751d}$ to $M_{741c}$ and $M_{751c}$ respectively in order for the whole device to be in the stable left right configuration, as shown in FIG. 7D.

The materials of the polarizing layers and the pairs of stabilizing layers can be the same in in-plane anisotropy and magnetization devices as they were in perpendicular to the plane anisotropy and magnetization devices with the exception that the magnetization vectors are oriented differently (in-plane versus perpendicular to the plane).

Figure 8A:
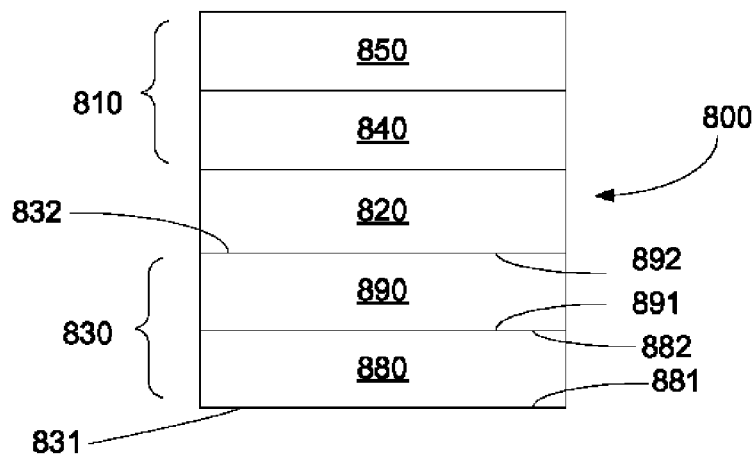
FIG. 8A is a schematic representation of a disclosed device that includes a controlling structure having a ferromagnetic layer and an antiferromagnetic layer.

Another exemplary embodiment of a disclosed device includes a controlling structure that does not include a stabilizing layer and polarizing layer but instead includes a ferromagnetic layer that is exchange coupled to an antiferromagnetic layer. An exemplary embodiment is depicted in FIG. 8A. The device 800 depicted in FIG. 8A includes a controllable structure 810 and a tunneling barrier structure 820 as discussed above. The controlling structure 830 in embodiments such as these includes an antiferromagnetic layer 880 and a ferromagnetic layer 890. The antiferromagnetic layer 880 has a first surface 881 and a second surface 882. The ferromagnetic layer 890 has a first surface 891 and a second surface 892. The second surface 882 of the antiferromagnetic layer 880 can be adjacent to, directly adjacent to or in contact with the first surface 891 of the ferromagnetic layer 890 (similarly, the first surface 891 of the ferromagnetic layer 890 can be adjacent to, directly adjacent to or in contact with the second surface 882 of the antiferromagnetic layer). The second surface 892 of the ferromagnetic layer 890 can be adjacent to, directly adjacent to, or in contact with the first surface of the tunneling barrier structure 820 (similarly, the first surface of the tunneling barrier structure 820 can be adjacent to, directly adjacent to, or in contact with the second surface 892 of the ferromagnetic layer 890). The first surface 831 of the controlling structure 830 can be substantially composed of the antiferromagnetic layer 880 and the second surface 832 of the controlling structure 830 can be substantially composed of the ferromagnetic layer 890.

An antiferromagnetic layer generally includes two sublattices of magnetic moments pointing in opposite directions. When a ferromagnetic layer is in contact with it, the magnetization of the ferromagnetic layer is pinned to the magnetic orientation of the antiferromagentic layer. Examples of suitable materials for the antiferomagentic layer include PtMn, IrMn, PtPdMn, FeMn, NiMn and others.

The ferromagnetic layer may be made of any useful ferromagnetic material such as, for example, Fe, Co or Ni and alloys thereof, such as NiFe and CoFe, and ternary alloys, such as CoFeB. Either or both of the ferromagnetic layer and antiferromagnetic layer may be either a single layer or an unbalanced synthetic antiferromagnetic (SAF) coupled structure, i.e., two ferromagnetic sublayers separated by a metallic spacer, such as Ru or Cu, with the magnetization orientations of the sublayers in opposite directions to provide a net magnetization. Either or both of the ferromagnetic layer and antiferromagnetic layer can be about 0.1 nm to about 10 nm thick, depending on the material.

Figure 8B:
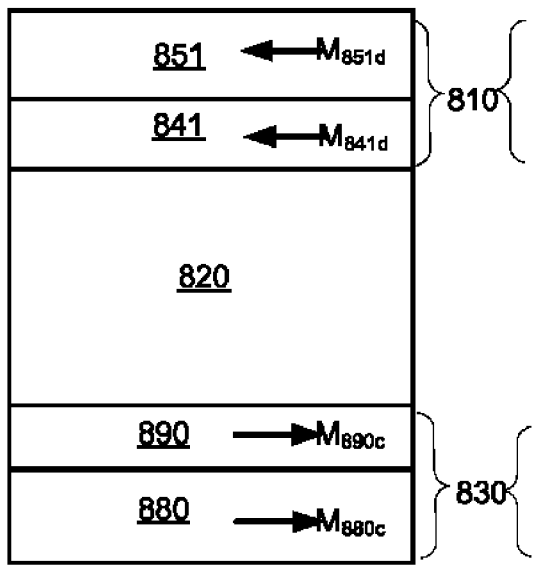
FIG. 8B depicts the exemplary device of FIG. 8A before a first current is applied thereto.

Devices such as those depicted in FIG. 8A also have two stable configurations. The first is shown in FIG. 8B and has the magnetic moments of the controlling structure 830 antiparallel to the magnetic moments of the controllable structure 810, referred to again as "stable right-left configuration". This is depicted by the arrows depicting the magnetic moment of the antiferromagnetic layer $M_{880c}$ and the ferromagnetic layer $M_{890c}$ of the controlling structure 830 that both have right orientations; and the magnetic moment of the polarizing layer $M_{841d}$ and the stabilizing layer $M_{851d}$ of the controllable structure 810 that both have left orientations. The second stable configuration (not depicted) is the opposite and is referred to as the "stable left-right configuration". In this configuration, the magnetic moment of the antiferromagnetic layer 880 and the ferromagnetic layer 890 of the controlling structure 830 would both have left orientations (as opposed to the right orientations shown in FIG. 8B); and the magnetic moment of the polarizing layer 841 and the stabilizing layer 851 of the controllable structure 810 would both have right orientations (as opposed to the left orientations shown in FIG. 8B).

Figure 8C:
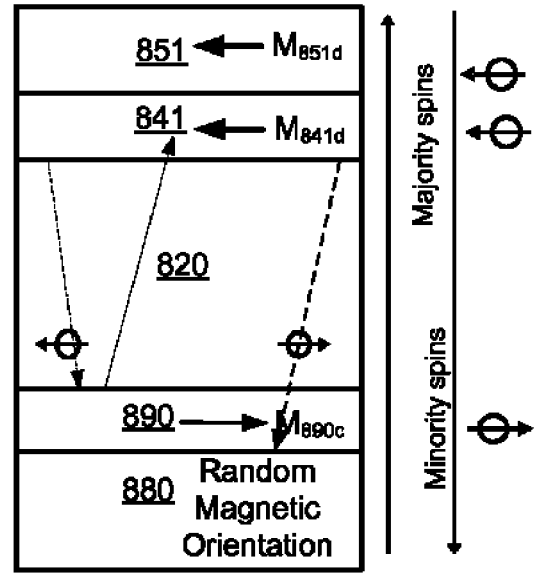
FIGS. 8C and 8D depict the exemplary device of FIG. 8A while the first current is flowing through the device.

FIG. 8C depicts the device of FIG. 8B once a first unipolar current is applied from the controlling structure 830 to the controllable structure 810 (as depicted by the arrow labeled I). In this example, a majority of the electrons are spin left electrons. The spin left electrons are shown on the left of the tunnel barrier structure 820 and the spin right electrons are shown on the right of the tunnel barrier structure 820. As the electrons flow from the controllable structure 810 to the controlling structure 830, the electrons that are aligned with the ferromagnetic layer 890 are transmitted through the ferromagnetic layer 890 and through the remainder of the device. The electrons that have a spin that us opposite to the ferromagnetic layer 890 enter the ferromagnetic layer 890 and because they are opposite create a torque that exerts a force on the ferromagnetic layer 890. It should also be noted that some of these electrons are back scattered but because they are aligned with the magnetization of the polarizing layer 841 and the stabilizing layer 851 they do not exert a torque on the controllable structure 810.

Figure 8D:
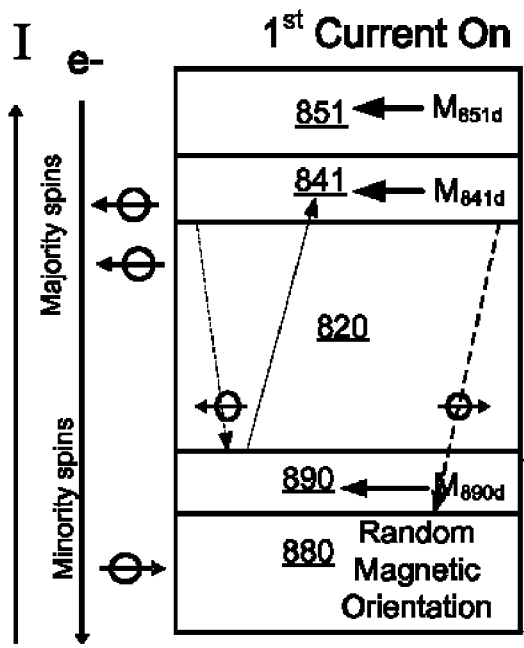

Application of a first current will also cause the antiferromagnetic layer 880 to become superparamagentic, i.e., it will have no majority magnetic orientation and the magnetic moments of the antiferromagnetic layer 880 will become randomized. This will "unpin" the ferromagnetic layer 890, which allows its magnetic orientation to be switched by the torque from the electrons that are opposite to the magnetization of the ferromagnetic layer 890. Specifically, the opposite spin electrons that enter the ferromagnetic layer 890 of the controlling structure 830 will exert a spin torque on the ferromagnetic layer 890 and cause its orientation to be flipped from $M_{890c}$ (as shown in FIG. 8C) to $M_{890d}$ (as shown in FIG. 8D). FIG. 8D depicts the device after the antiferromagnetic layer 880 has become superparamagnetic and the magnetization vector of the ferromagnetic layer 890 has been flipped but before the second current has been applied (i.e. a current less than the first current or a current of zero amplitude).

Figure 8E:
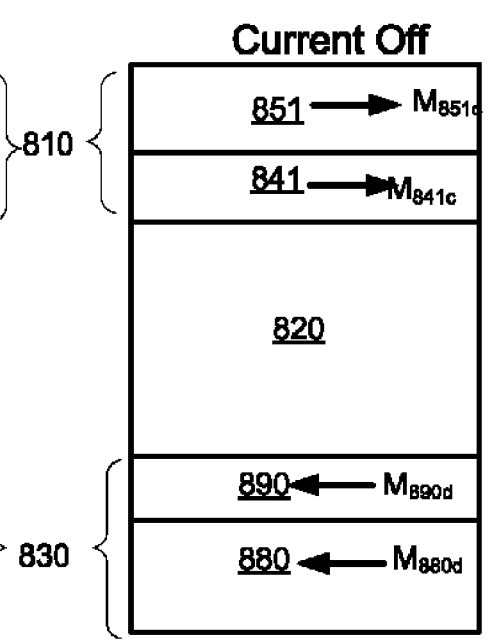
FIG. 8E depicts the exemplary device of FIG. 8A while a second current is applied thereto.

FIG. 8E depicts the device once the current is turned off or decreased. The antiferromagnetic layer 880 cools down and becomes exchange coupled to the ferromagnetic layer 890 (in this example the ferromagnetic layer 890 has a left orientation $M_{890d}$ because of the influence of the spin torque of the opposite spin electrons that entered the ferromagnetic layer 890) thereby changing its magnetic orientation to a left orientation as well $M_{880d}$. The magnetic field from the ferromagnetic layer 890 then affects the controllable structure 810 and changes the orientation of the polarizing layer 841 and the stabilizing layer 851 to $M_{841c}$ and $M_{851c}$ respectively. This causes the device to take on the stable left right configuration shown in FIG. 8E.

For the controllable structure 810 to be flipped by the controlling structure 830, the exchange field from the antiferromagnetic layer 880 must be larger than the coercivity ($H_c$) of the controllable structure 810. Such is the case when the ferromagnetic layer 890 is a material that is generally a soft magnetic material (i.e. has a low magnetic anisotropy) and the antiferromagnetic layer 880 is a material that has a relatively low blocking temperature. In embodiments, a soft magnetic material is one with an intrinsic anisotropy of less than about 100 Oersted (Oe) for example. In embodiments, a material that has a relatively low blocking temperature is one that has a blocking temperature of less than about 150° C., for example.

In embodiments such as those depicted in FIG. 8A-8E, it may be advantageous to maintain some level of current through the device at all times, instead of turning the current on an turning the current off. In embodiments, a first current can be applied and then a second current can be applied, with the second current having an amplitude that is less than the first current. This may cause the temperature to drop enough that the antiferromagnetic layer 880 can reorder magnetically and once combined with the spin torque from the controllable structure 810 stabilize the ferromagnetic layer 890 during the time necessary for exchange coupling of the antiferromagnetic layer 880 to become larger than the coercivity of the controllable structure 810.

Figure 9:
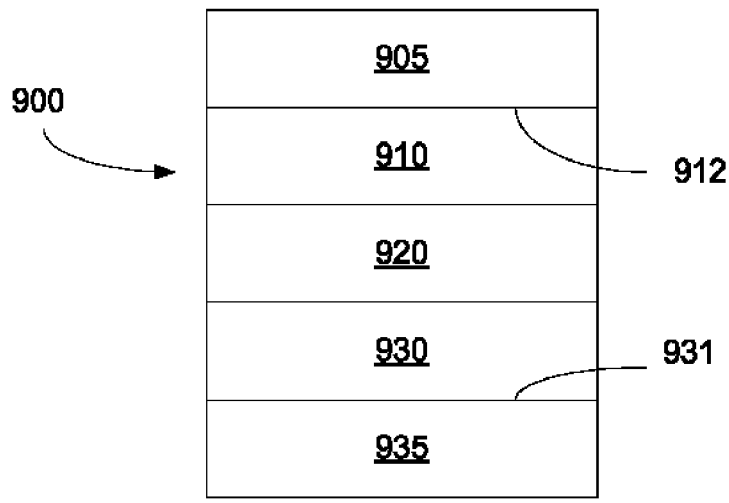
FIG. 9 is a schematic representation of a disclosed device with an optional seed layer and cap layer.

Disclosed devices can also optionally include additional layers. FIG. 9 demonstrates an exemplary embodiment of a device that includes a controlling structure 930, a tunneling barrier structure 920 and a controllable structure 910. This exemplary device can also include a cap layer 905. The cap layer 905 can be positioned adjacent to, directly adjacent to or in contact with the second surface 912 of the controllable structure 910. A cap layer 905 can generally function to protect the device from environmental conditions. Exemplary materials for cap layer 905 can include tantalum (Ta) or tantalum nitride (TaN) for example. In embodiments a layer of Ta or TaN of about 100 Angstroms (Å) can be utilized as a cap layer 905. Any of the embodiments depicted, described or disclosed herein can optionally include a cap layer.

Another optional layer that can be included in disclosed devices is a seed layer. The exemplary device depicted in FIG. 9 includes a seed layer 935. The seed layer 935 can be positioned adjacent to, directly adjacent to or in contact with the first surface 931 of the controlling structure 930. A seed layer 935 can generally function to assist the formation and structural stability of the device and specifically the first surface 931 of the controlling structure 930. The materials that make up the seed layer 935 can vary and can depend at least in part on the particular components that make up the first portions, i.e. the first surface 931 of the controlling structure 930. Any of the embodiments depicted, described or disclosed herein can optionally include a seed layer.

Disclosed devices provide a magnetic device that can be easily switched using a unipolar current through the spin torque transfer effect. The ability to switch the device using unipolar current as opposed to bipolar current can provide advantages for numerous applications. Devices disclosed herein can be utilized in forming non-volatile magnetic random access memory (MRAM); in various electrical applications, devices disclosed herein can be utilized as switches for example such as for on-chip power mode control; and in routers such as switch based routers or field programmable gate arrays (FPGA) for example.

Figure 10:
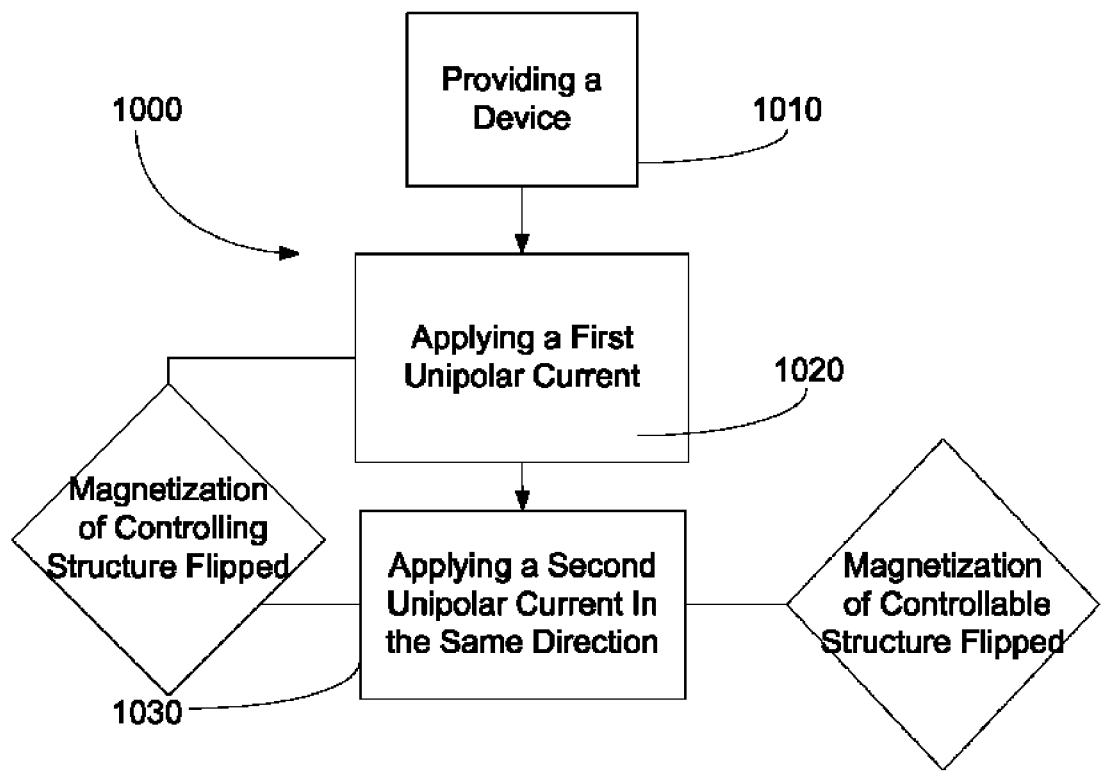
FIG. 10 depicts an exemplary disclosed method.

Methods of affecting the properties of an electronic device are also disclosed herein. One such exemplary method is exemplified by FIG. 10. The method 1000 includes the steps of providing a device 1010, applying a first current to the device 1020 and applying a second current to the device 1030. The step of providing a device may be accomplished by manufacturing a device as disclosed herein or obtaining a pre-manufactured device as disclosed herein.

The step 1020 of applying a first current to the device may be accomplished using generally utilized electrical connections. The first current that is applied to the device is a unipolar current. The amplitude and other properties of the first current can depend at least in part on the materials that make up the device and the application for which the device will be utilized. The current can be applied to the device in one of two ways, by applying the current in a direction that has it flowing from the controlling structure to the controllable structure or by applying the current in a direction that has it flowing from the controllable structure to the controlling structure. The particular direction of current flow that will be chosen can depend on the type of device. For example, if the device is a perpendicular to the plane anisotropy and magnetization device current can be applied to flow from the controllable structure to the controlling structure of the device. If the device is an in-plane anisotropy and magnetization device current can be applied to flow from the controlling structure to the controllable structure of the device.

The step 1020 of applying a first current to the device will cause the magnetization orientation of the magnetization controlling structure to be flipped. For example, in the case of a perpendicular to the plane anisotropy and magnetization device, applying a current from the controllable structure to the controlling structure of the device will cause the magnetization orientation of the magnetization controlling structure to be flipped from up to down or down to up. In perpendicular to the plane anisotropy and magnetization devices, the flip in magnetization orientation of the controlling structure is caused by the spin torque exhibited by the minority electron spins. In the case of an in-plane anisotropy and magnetization device, applying a current from the controlling structure to the controllable structure of the device will cause the magnetization orientation of the magnetization controlling structure to be flipped from right to left or left to right. In in-plane anisotropy and magnetization devices, the flip in magnetization orientation of the controlling structure is caused by the spin torque exhibited by the majority electron spins.

The next step 1030 is to apply a second current to the device. The second current is applied in the same direction as the first current. The second current generally has an amplitude that is less than the first current. In embodiments, applying a second current to the device includes ceasing application of a current, i.e. there is no second current applied to the device, or the second current has an amplitude of 0 V. In embodiments, applying a second current to the device includes applying a current that has an amplitude that is less than the first current but is not zero. The step of applying the second current may be accomplished by turning off the source of current or altering the electrical connections to effectively turn off the source of current to the device, or by decreasing the amplitude of the current from the source of current or by altering the electrical connections to effectively diminish the amplitude of the current.

The step 1030 of applying a second current will cause the magnetization orientation of the magnetization controllable structure to be flipped. For example, in the case of a perpendicular to the plane anisotropy and magnetization device, applying a second current will cause the magnetization orientation of the magnetization controllable structure to be flipped from up to down or down to up. In the case of an in-plane anisotropy and magnetization device, applying a current from the controlling structure to the controllable structure of the device will cause the magnetization orientation of the magnetization controllable structure to be flipped from right to left or left to right. In both perpendicular and in-plane anisotropy and magnetization devices, the flip of the magnetization controllable structures is caused by the demagnetization field (also referred to as stray field) from the controlling structure acting on the controllable structure to obtain one of the magnetically stable configurations of the device. In perpendicular to the plane anisotropy and magnetization devices, once the magnetization orientation of the magnetization controllable structure is flipped, the magnetization orientation of the magnetization controlling structure and the magnetization orientation of the magnetization controllable structure are parallel. In an in-plane anisotropy and magnetization device, once the magnetization orientation of the magnetization controllable structure is flipped, the magnetization orientation of the magnetization controlling structure and the magnetization orientation of the magnetization controllable structure are anti-parallel.

Methods that include other steps not disclosed herein carried out before, after or in between the steps disclosed herein are also contemplated by the disclosure.

Thus, embodiments of ELECTRONIC DEVICES UTILIZING SPIN TORQUE TRANSFER TO FLIP MAGNETIC ORIENTATION are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present disclosure is limited only by the claims that follow.

What is claimed is:

1. An electronic device comprising:
   a magnetization controlling structure;
      wherein the magnetization controlling structure has a first magnetic coercivity at a first temperature and a second magnetic coercivity at a second temperature higher than the first temperature;
   a tunnel barrier structure; and
   a magnetization controllable structure comprising:
      a first polarizing layer; and
      a first stabilizing layer,
   wherein the magnetization controllable structure has a first magnetic coercivity at the first temperature and a second magnetic coercivity at the second temperature,
   wherein the tunnel barrier structure is between the magnetization controlling structure and the magnetization controllable structure and the first polarizing layer is between the first stabilizing layer and the tunnel barrier structure and
   wherein the first magnetic coercivity of the magnetization controlling structure is higher than the first magnetic coercivity of the magnetization controllable structure and the second magnetic coercivity of the magnetization controlling structure is lower than the second magnetic coercivity of the magnetization controllable structure.

2. The electronic device according to claim 1, wherein the magnetization controlling structure comprises a second polarizing layer and a second stabilizing layer.

3. The electronic device according to claim 2, wherein the first temperature is room temperature and the second temperature is the operating temperature of the electronic device, and the first and second stabilizing layers comprise materials with different magnetic coercivities at different temperatures.

4. The electronic device according to claim 2, wherein the first and second polarizing layers are independently chosen from the group consisting of: cobalt (Co), iron (Fe), cobalt iron alloys (CoFe), cobalt iron boron alloys (CoFeB), and combinations thereof.

5. The electronic device according to claim 2, wherein the first and second stabilizing layers are independently chosen from the group consisting of: alloys of gadolinium (Gd), alloys of terbium (Tb), alloys of dysprosium (Dy), alloys of cobalt (Co) and alloys of samarium (Sm).

6. The electronic device according to claim 2, wherein the first and second stabilizing layers are independently chosen from GgTbCoFe and TbCoFe.

7. The electronic device according to claim 2, wherein the first stabilizing layer is chosen from the group consisting of: CoCrPt, CoPt, Co/Pt Co/Ni, Co/Cu and Co/Pd; and the second stabilizing layer comprises TbCoFe.

8. A method of affecting the properties of an electronic device comprising the steps of:
   providing an electronic device, the electronic device comprising
      a magnetization controlling structure;
         wherein the magnetization controlling structure has a first magnetic coercivity at a first temperature and a second magnetic coercivity at a second temperature higher than the first temperature;
      a tunnel barrier structure; and
      a magnetization controllable structure comprising:
         a first polarizing layer; and
         a first stabilizing layer,
      wherein the magnetization controllable structure has a first magnetic coercivity at the first temperature and a second magnetic coercivity at the second temperature,
      wherein the tunnel barrier structure is between the magnetization controlling structure and the magnetization controllable structure and the first polarizing layer is between the first stabilizing layer and the tunnel barrier structure and
      wherein the first magnetic coercivity of the magnetization controlling structure is higher than the first magnetic coercivity of the magnetization controllable structure and the second magnetic coercivity of the magnetization controlling structure is lower than the second magnetic coercivity of the magnetization controllable structure;

applying a first unipolar current to the electronic device, wherein the first current causes the magnetization orientation of the magnetization controlling structure to be flipped; and applying a second unipolar current in the same direction as the first unipolar current to the electronic device, wherein application of the second unipolar current causes the magnetization orientation of the magnetization controllable structure to be flipped.

9. The method according to claim 8, wherein the magnetization controllable structure has magnetic anisotropy that is perpendicular to the plane of the device.

10. The method according to claim 9, wherein the current is passed through the device from the magnetization controllable structure to the magnetization controlling structure.

11. The method according to claim 9, wherein once the magnetization orientation of the magnetization controllable structure is flipped, the magnetization orientation of the magnetization controlling structure and the magnetization orientation of the magnetization controllable structure are parallel.

12. The method according to claim 8, wherein the magnetization controllable structure has magnetic anisotropy that is parallel to the plane of the device.

13. The method according to claim 12, wherein the current is passed through the device from the magnetization controlling structure to the magnetization controllable structure.

14. An electronic device comprising:
a magnetization controllable structure comprising:
   a first polarizing layer; and
   a first stabilizing layer;
a tunnel barrier structure; and
a magnetization controlling structure comprising:
   an antiferromagnetic layer; and
   a ferromagnetic layer exchange coupled to the antiferromagnetic layer,
wherein the tunnel barrier structure is between the magnetization controlling structure and the magnetization controllable structure and the first polarizing layer is between the first stabilizing layer and the tunnel barrier structure,
wherein the electronic device has two stable overall magnetic configurations.

15. The electronic device according to claim 14, wherein the first stabilizing layer is chosen from the group consisting of: alloys of gadolinium (Gd), alloys of terbium (Tb), alloys of dysprosium (Dy), alloys of cobalt (Co) and alloys of samarium (Sm).

16. The electronic device according to claim 14, wherein the first stabilizing layer is chosen from the group consisting of: GgTbCoFe and TbCoFe.

17. The electronic device according to claim 14, wherein the first stabilizing layer is chosen from the group consisting of: CoCrPt, CoPt, Co/Pt Co/Ni, Co/Cu and Co/Pd.

18. The electronic device according to claim 14 further comprising a seed layer and a cap layer.

19. The electronic device according to claim 14, wherein the magnetization controlling structure comprises a second polarizing layer and a second stabilizing layer.

20. The electronic device according to claim 19, wherein the first stabilizing layer is chosen from the group consisting of: CoCrPt, CoPt, Co/Pt Co/Ni, Co/Cu and Co/Pd; and the second stabilizing layer comprises TbCoFe.

* * * * *